United States Patent
Liu et al.

(10) Patent No.: US 6,534,853 B2
(45) Date of Patent: Mar. 18, 2003

(54) SEMICONDUCTOR WAFER DESIGNED TO AVOID PROBED MARKS WHILE TESTING

(75) Inventors: An-Hong Liu, Tainan (TW); Yuan-Ping Tseng, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 7 days.

(21) Appl. No.: 09/873,420

(22) Filed: Jun. 5, 2001

(65) Prior Publication Data

US 2002/0180026 A1 Dec. 5, 2002

(51) Int. Cl.⁷ .............................................. H01L 29/72
(52) U.S. Cl. .................. 257/692; 257/690; 257/691; 257/694; 324/765
(58) Field of Search ............................. 257/690, 691, 257/692, 694; 324/765

(56) References Cited

U.S. PATENT DOCUMENTS

| | | |
|---|---|---|
| 5,554,940 A | 9/1996 | Hubacher .................. 324/765 |
| 2001/0052786 A1 * | 12/2001 | Eldridge et al. ............ 324/765 |

* cited by examiner

*Primary Examiner*—Edward Wojciechowicz
(74) *Attorney, Agent, or Firm*—Troxell Law Office PLLC

(57) ABSTRACT

A semiconductor wafer is disclosed for avoiding probed marks while testing. The wafer has a plurality of metal interconnects, each metal interconnect connecting underlying bonding pad, corresponding contact pad and test pad. Each contact pad being outer electrical connection terminal is connected in series by a metal interconnect between test pad and bonding pad, so that the section of the metal interconnect between bonding pad and contact pad enable be tested during probing the test pad. Furthermore, there is no probing mark on the contact pad.

14 Claims, 6 Drawing Sheets

SEMICONDUCTOR WAFER DESIGNED TO AVOID PROBED MARKS WHILE TESTING

FIELD OF THE INVENTION

The present invention is relating to a semiconductor wafer for avoiding probed marks while testing, particularly to a semiconductor wafer with bumps and separate testing pads or bumps.

BACKGROUND OF THE INVENTION

Conventionally, wafer sorting or chip probing of integrated circuits is to probe directly bonding pads or bumps on wafer with probe needles which will causes probed marks on bonding pads or bumps. These probed marks will cause reliability issues in further processing such as package/module assmbly.

A semiconductor device designed to avoid probed marks on bumps while testing is disclosed in U.S. Pat. No. 5,554,940, "Bumped semiconductor device and method for probing the same". There are bumps of flip chip application and separate test pads on a semiconductor chip so that no need for probing the bumps while testing. As shown in FIGS. 1, 2, 3, a semiconductor chip 10 has a plurality of bonding pads 12 embedded between inner dielectric layer 18, 20 and insulation layer 22. The bonding pads 12 are connected with the integrated circuits of semiconductor chip 10 by using the metal plug 16 and metal interconnect 14, and there are a plug 38 piercing through the insulation layer 22 on the bonding pad 12 and a conduction pad 34 above the plug 38 for linking the redistribution structure 26 on the surface having bonding pads 12. Each redistribution structure 26 has a test pad 28, a bump pad 30, a bump interconnect 32 and a test interconnect 36 (as shown in FIG. 2), electrically connecting the bump pad 30 with the corresponding bonding pad 12 or test pad 28 by the bump interconnect 32, and electrically connecting the test pad 28 with the corresponding bonding pad 12 by the test interconnect 36. As shown in FIG. 2, the plurality of redistribution structures 26 are covered by a passivation layer 40, the passivation layer 40 has a plurality of openings 42 so as to open the test pad 28 and bump pad 30 (as shown in FIGS. 3, 4), wherein the test pad 28 is used to be probed by the probe needle 50. Besides, as shown in FIGS. 2, 4, a bump 48 is formed on the bump pad 30 and a metal barrier layer 44 is formed between the bump 48 and the bump pad 30. While testing the semiconductor chip 10, test pad 28 probed by probe needle 50 conducts testing signals through test interconnect 36, conduction pad 34 and plug 38 to the bonding pad 12without testing through the bump interconnect 32. Therefore, it is impossible to know if bump interconnect 32 is in good condition or not, i.e., there is no way to tell if the bump interconnect 32 is either open or short from probing at test pad 28 which will provide incorrect test result.

SUMMARY OF THE INVENTION

The main purpose of the present invention is to provide a semiconductor wafer designed to avoid probed marks while testing. The wafer has a plurality of metal interconnects and each metal interconnect connects to the corresponding contact pad/ bump, test pad/bump and bonding pad. The contact pad/bump, being an outer connection terminal, is connected in series by the metal interconnect between the corresponding test pad/bump and bonding pad, so that the metal interconnect between the bonding pad and the contact pad can be tested during probing at the test pad/bump. Furthermore, there will be no probed marks on the contact pad/bump.

According to the present invention, a semiconductor wafer designed to avoid probed marks while testing comprises:

a plurality of semiconductor chips, each chip having an integrated circuit forming surface formed on the same plane of semiconductor wafer, wherein the chip has a plurality of bonding pads on the integrated circuit forming surface;

a plurality of cutting paths, each cutting path formed between two adjoining chips;

a plurality of metal interconnects, which are on the integrated circuit forming surface of a chip, and electrically connect with corresponding bonding pads respectively;

a passivation layer, which covers a plurality of metal interconnects, and has a plurality of the first openings and the second openings;

a plurality of test pads, which are located at the first openings of the passivation layer and each conducts to corresponding bonding pad through a corresponding metal interconnect; and a plurality of contact pads, which are located at the second openings of the passivation layer, wherein the contact pad is connected in series by the corresponding metal interconnect between the corresponding bonding pad and test pad.

DETAILED DESCRIPTION OF THE PRESENT INVENTION

Figure 1:
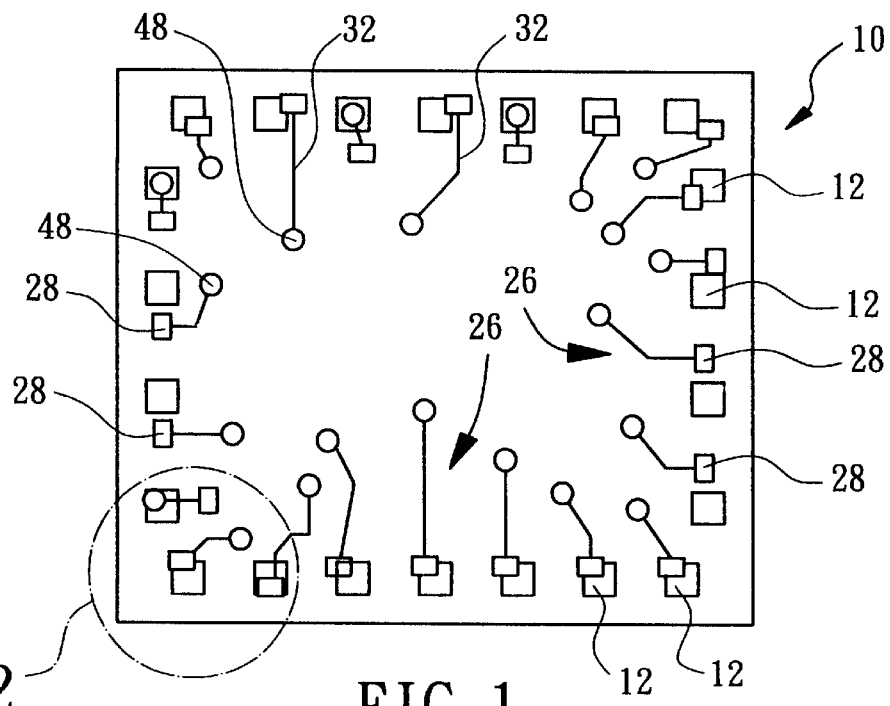
FIG. 1 is a top view of the chip disclosed in U.S. Pat. No. 5,554,940 "Bumped semiconductor device and method for probing the same".
Figure 2:
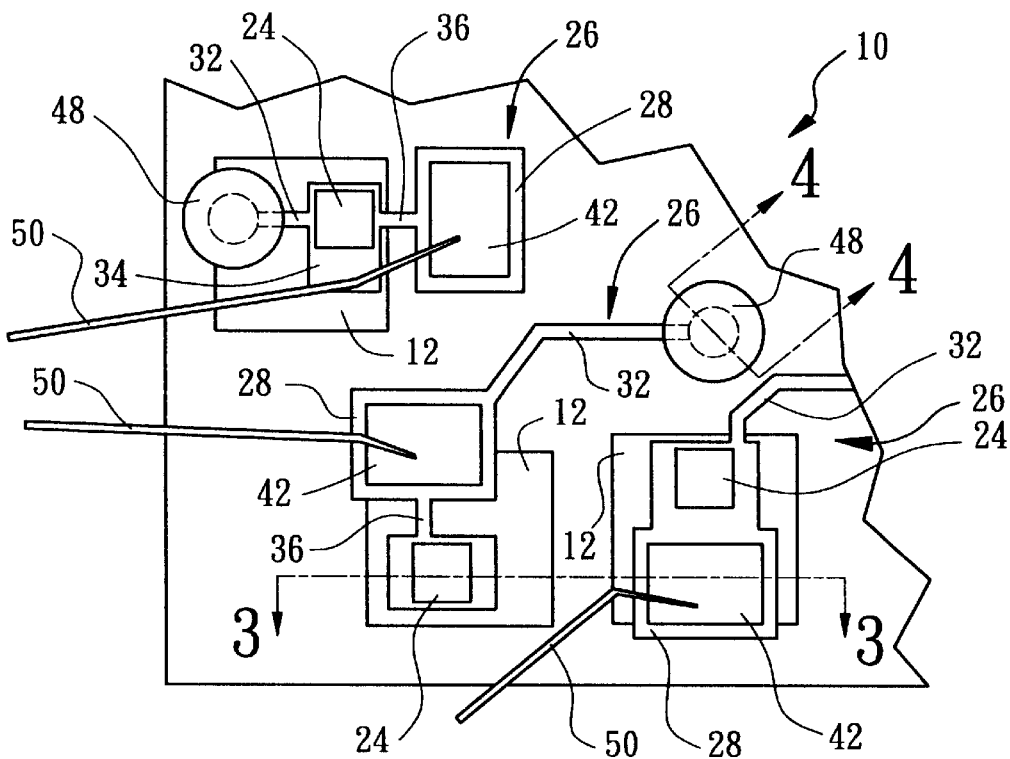
FIG. 2 is a partially enlarged view of the conventional chip of FIG. 1.
Figure 3:
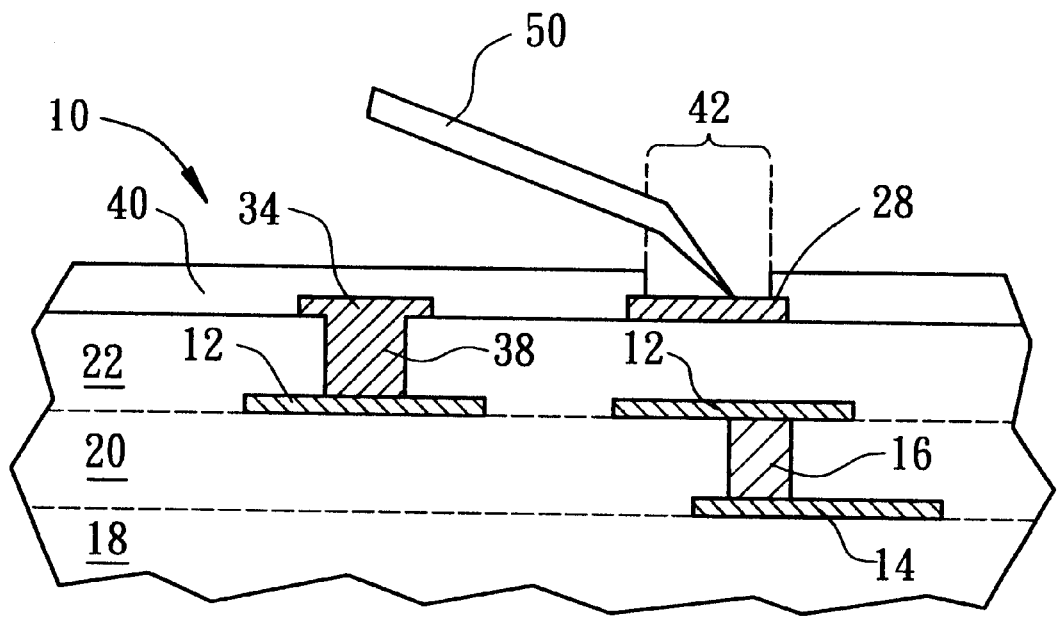
FIG. 3 is a cross sectional view along FIG. 2 Line 3—3.
Figure 4:
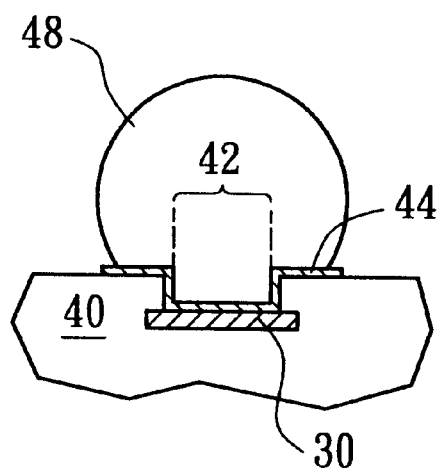
FIG. 4 is a cross sectional view along FIG. 2 Line 4—4.

Please referring to the drawings attached, the present invention will be described by means of embodiments below.

Figure 5:
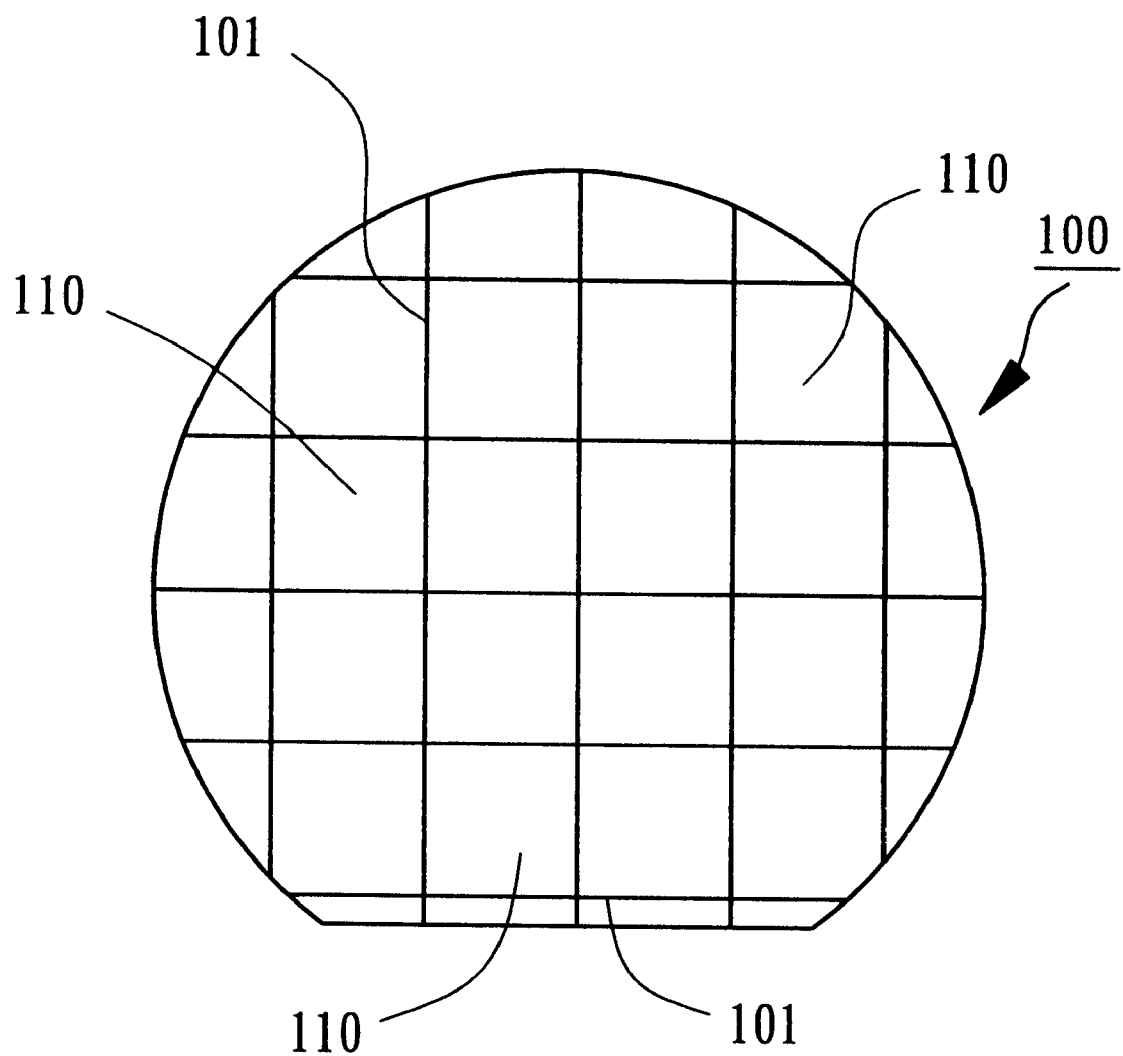
FIG. 5 is a diagram of a semiconductor wafer of the present invention.

As shown in FIG. 5, a semiconductor wafer 100 of the present invention includes a plurality of semiconductor chips 110 and cutting paths 101 between two adjoining chips along the cutting path cutting to be individual semiconductor chips 110.

Figure 6:
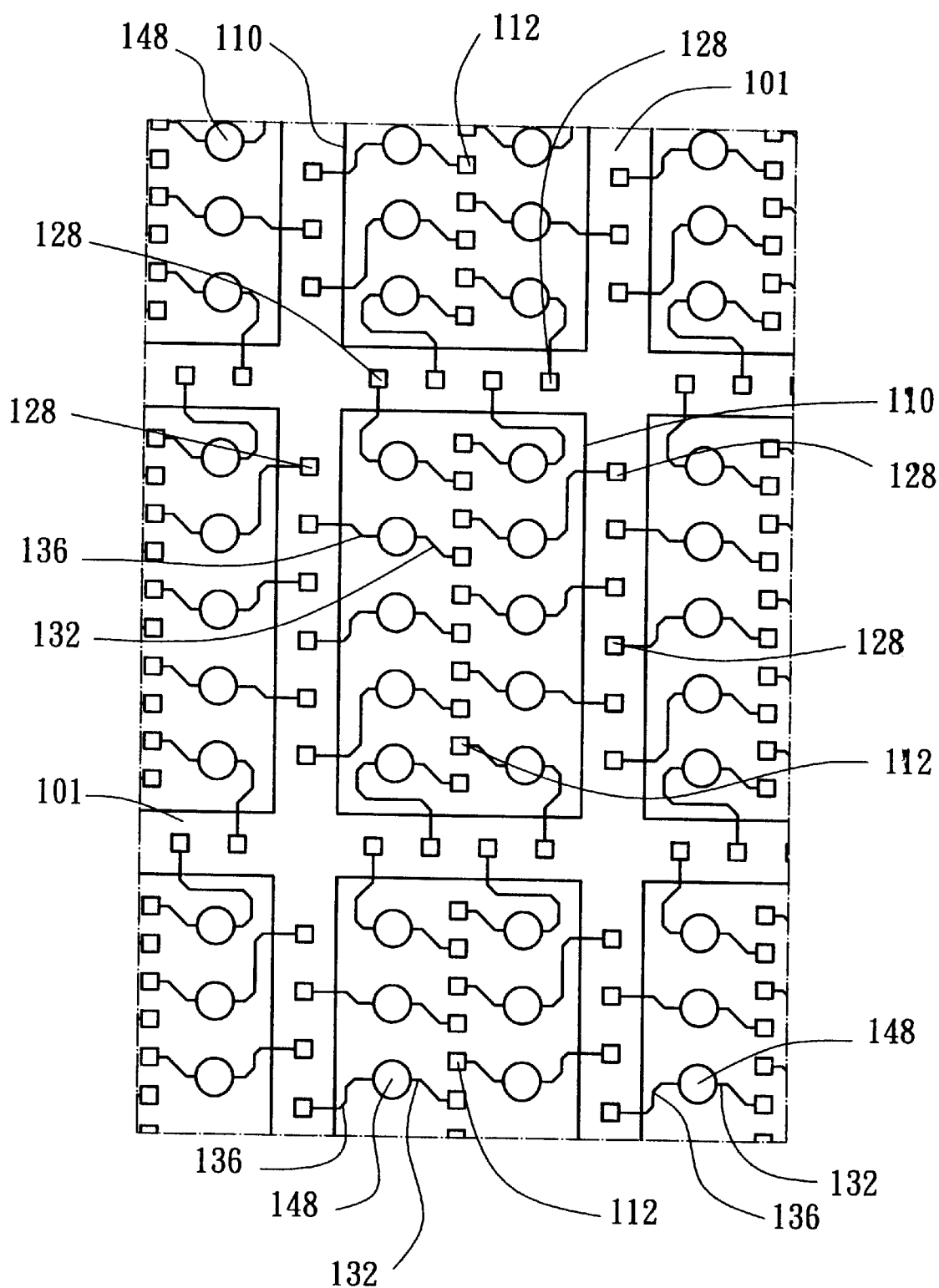
FIG. 6 is a partially enlarged view of a semiconductor wafer according to the first embodiment of the present invention.
Figure 7:
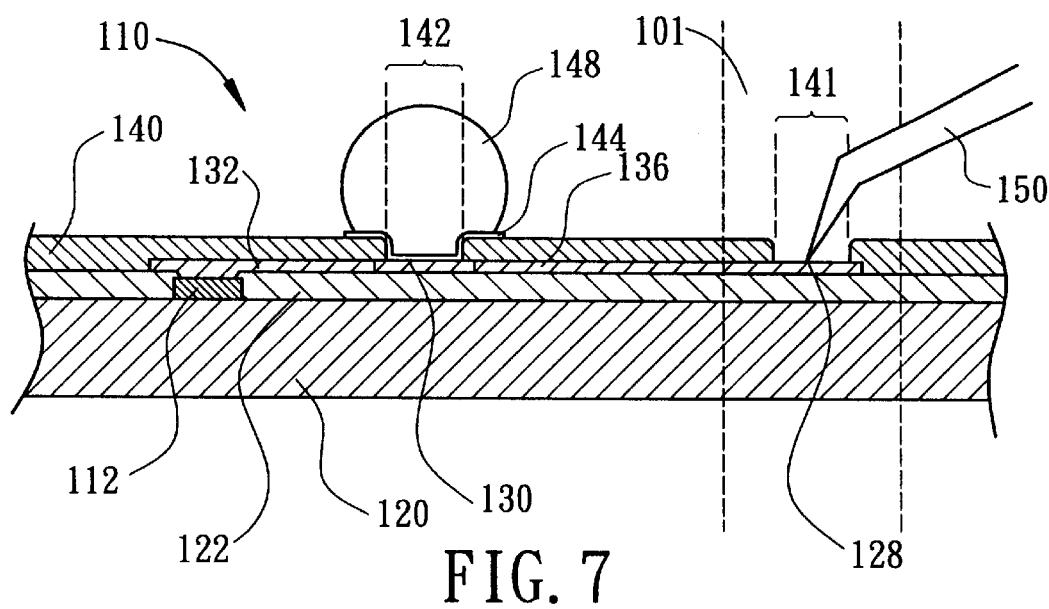
FIG. 7 is a cross sectional view along a metal interconnect of FIG. 6.

As shown in FIGS. 6, 7, the integrated circuit forming surface of the semiconductor chip 110 has a plurality of bonding pads 112 connecting with integrated circuits, being located on the substrate 120 and an insulation layer 122 like silicon dioxide, PSG, BPSG, TEOS, etc. The insulation layer 122 has the openings to expose bonding pads 112 that are the general structure for bare chips. By the technique of photolithography, vapor deposition, and etching, a plurality of metal interconnects 132 and 136, contact pads 130 and test pads 128 are formed on the insulation layer 122. Each metal interconnect is divided to a contact interconnect 132 and a test interconnect 136. The contact pads 130 is used as an outer electrical connection terminal of the semiconductor chip 110 and located on a surface of semiconductor chip 110, electrically connected with corresponding bonding pads 112 by contact interconnect 132. Preferably, there are barrier layer 144 and bump 148 formed above the contact pad 130 so that the semiconductor chip 110 is a flip-chip type. The test pad 128 is used as a testing end for semiconductor chip 110, electrically connected with corresponding contact pad 130 by test interconnect 136. In this embodiment, the test pads 128 are located around the perimeter of chip 110 and on the cutting path 101. Besides, a passivation layer 140, such as polyimide, benezo cyclobutene, or other low dielectric constant materials, is formed on the insulation layer 122 and covers contact interconnects 132 and test interconnects 136 (i.e. metal interconnect). The passivation layer 140 has a plurality of the first openings 141 and the second openings 142. The first opening 141 at least partially exposes test pad 128, and the second opening 142 is corresponding to contact pad 130.

The contact pad 130 is connected in series between corresponding bonding pad 112 and test pad 128 by a corresponding metal interconnect. While executing wafer level testing of the semiconductor wafer 100, a probe needle 150 is probed at the test pad 128 for testing. The conductive path between test pad 128 and bonding pad 112 passes through both test interconnect 136 and contact interconnect 132 so that not only test interconnect 136 but also contact interconnect 132 simultaneously can be tested and probed marks avoided while executing wafer probing. Furthermore, due to the test pad 128 being on the cutting path 101 or partially overlaying on the cutting path 101, there is a spacious area for forming contact pads 130, also it is possible to arrange a large quantity of test pad 128 or contact pad 130 on a semiconductor chip for a semiconductor device with a lots of terminals.

Figure 8:
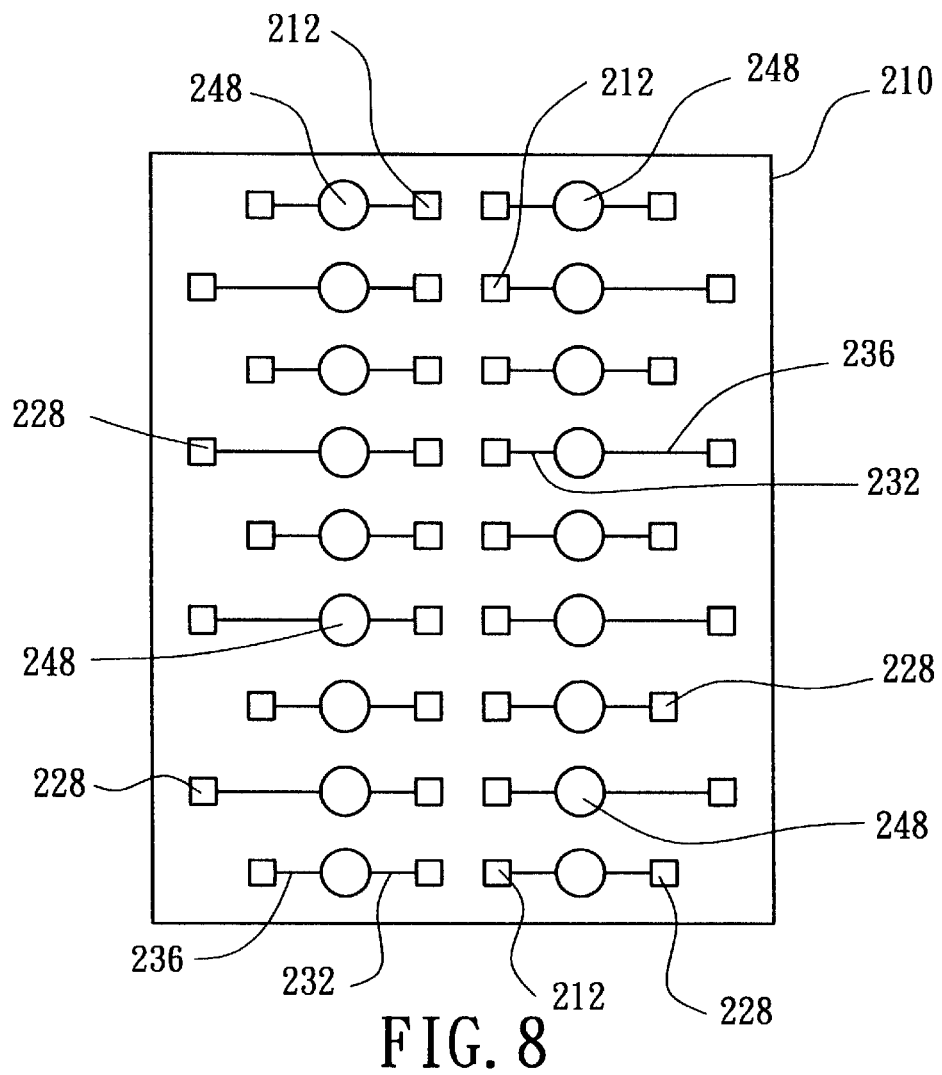
FIG. 8 is the test pads layout and contact diagram for a semiconductor chip according to the second embodiment of the present invention.

The second embodiment of the present invention is shown in FIG. 8, a semiconductor chip 210 has a rectangle-shaped integrated circuit forming surface forming a plurality of bonding pads 212, bumps 248 and test pads 228. The bonding pads 212 connect with corresponding bumps 248 by a contact interconnect 232, the bumps 248 connect with corresponding test pads 228 by the test interconnect 236. A passivation layer is used to cover contact interconnect 232, test interconnect 248, and bonding pad 12. In accordance with the test condition the test pad 228 could be flip-chip bump type or flat-pad type. The test pads 228 are distributed around the two corresponding sides of integrated circuit forming surface and arranged in zigzag pattern so that a larger spacing between two test pads can be obtained. The contact interconnect 232 also can be tested while testing the semiconductor chip 210 by probing the test pad 228.

Figure 9:
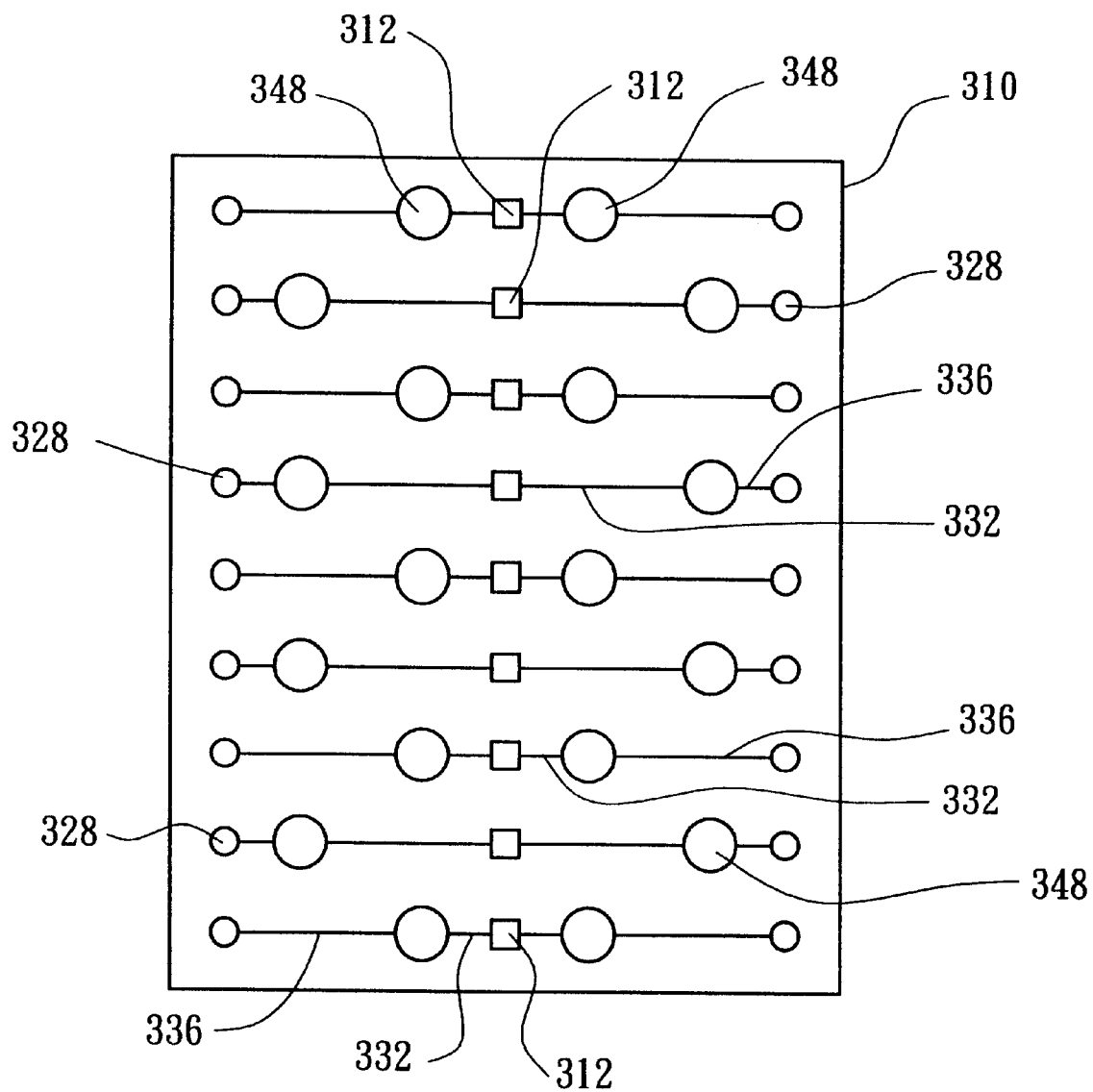
FIG. 9 is another test pads layout and contact diagram for a semiconductor chip according to the third embodiment of the present invention.

The third embodiment of the present invention is shown in FIG. 9, a semiconductor chip 310 has an integrated circuit forming surface with a plurality of bonding pads 312, bumps 348 and test bumps 328. The bonding pads 312 are formed on a center line of integrated circuit forming surface. The bonding pad 312 connects with the corresponding bump 348 by a redistribution interconnect 332, and the bump 348 connects with the corresponding test bump 328 by a test interconnect 336. Usually further a passivation layer covers over redistribution interconnects 332, test interconnects 336 and bonding pads 312. The test bumps 328 can be bump type or flat pad type according to test request and are arranged around the two corresponding sides of integrated circuit forming surface of the chip 310. The bumps 348 are arranged in zigzag pattern so that a larger spacing between two bumps can be obtained.

The above description of embodiments of this invention is intended to be illustrative and not limiting. Other embodiments of this invention will be obvious to those skilled in the art in view of the above disclosure.

What is claimed is:

1. A semiconductor wafer comprises:
    a plurality of semiconductor chips, each chip having an integrated circuit forming surface formed on the same plane of the semiconductor wafer, wherein the chip has a plurality of bonding pads on the integrated circuit forming surface;
    a plurality of cutting paths, each cutting path being formed between two adjoining chips;
    a plurality of metal interconnects being on the integrated circuit forming surface of the chip and electrically connecting with the corresponding bonding pad respectively;
    a passivation layer covering the plurality of the metal interconnects and having a plurality of the first openings and the second openings;
    a plurality of test pads located at the first openings of the passivation layer and connecting to the corresponding bonding pad through a corresponding metal interconnect; and
    a plurality of contact pads being located at the second opening of the passivation layer, wherein the contact pad is connected in series with corresponding metal interconnect between the corresponding bonding pad and test pad.

2. The semiconductor wafer of claim 1, further comprising a plurality of flip chip bumps being formed on the contact pads.

3. The semiconductor wafer of claim 1, further comprising a plurality of test bumps being formed on the test pads.

4. The semiconductor wafer of claim 1, wherein the test pads locate on the cutting paths.

5. The semiconductor wafer of claim 1, wherein the test pads partially overlay on the cutting path.

6. The semiconductor wafer of claim 1, wherein the integrated circuit forming surface of the chip is rectangle and the test pads are arranged in zigzag pattern.

7. The semiconductor wafer of claim 1, wherein the integrated circuit forming surface of the chip is rectangle and the test pads are located on the two corresponding sides of the integrated circuit forming surface.

8. The semiconductor wafer of claim 1, wherein the integrated circuit forming surface of the chip is rectangle and the test pads are located around the perimeter of the integrated circuit forming surface.

9. A semiconductor chip comprises:
    a plurality of bonding pads, each bonding pad being formed on the integrated circuit forming surface;
    a plurality of metal interconnects located on-the integrated circuit forming surface of the chip and electrically connecting with the corresponding bonding pads;
    a passivation layer covering the metal interconnects and having a plurality of the first openings and the second openings;

a plurality of test pads located at the first opening of the passivation layer, each conducting to the corresponding bonding pad through a corresponding metal interconnect; and a plurality of contact pads located at the second opening of the passivation layer, wherein each contact pad connects in series with a metal interconnect between the corresponding bonding pad and test pad.

10. The semiconductor chip of claim 9, further comprising a plurality of flip chip bumps formed on the contact pads.

11. The semiconductor chip of claim 9, further comprising a plurality of test bumps formed on the test pads.

12. The semiconductor chip of claim 9, wherein the integrated circuit forming surface of the chip is rectangle and a plurality of test pads are arranged in zigzag pattern.

13. The semiconductor chip of claim 9, wherein the integrated circuit forming surface of the chip is rectangle and a plurality of test pads around the two corresponding sides of the integrated circuit forming surface.

14. The semiconductor chip of claim 9, wherein the integrated circuit forming surface of the chip is rectangle and the test pads around the perimeter of the integrated circuit forming surface.

* * * * *